United States Patent
Boudot et al.

(10) Patent No.: US 9,864,340 B2
(45) Date of Patent: Jan. 9, 2018

(54) CAESIUM ATOMIC MICRO-CLOCK MICROCELL BUFFER GAS MIXTURE

(71) Applicant: THALES, Courbevoie (FR)

(72) Inventors: Rodolphe Boudot, Trepot (FR); Christophe Gorecki, Pin (FR); Vincent Maurice, Langres (FR); Eric Kroemer, Venise (FR); Bernard Fouilland, Fauconnieres (FR)

(73) Assignee: Thales, Courbevoie (FR)

( * ) Notice: Subject to any disclaimer, the term of this patent is extended or adjusted under 35 U.S.C. 154(b) by 171 days.

(21) Appl. No.: 14/885,742

(22) Filed: Oct. 16, 2015

(65) Prior Publication Data
US 2016/0109859 A1 Apr. 21, 2016

(30) Foreign Application Priority Data

Oct. 17, 2014 (FR) ..................................... 14 02343

(51) Int. Cl.
*H01S 1/06* (2006.01)
*G04F 5/14* (2006.01)
*H03L 7/26* (2006.01)

(52) U.S. Cl.
CPC .............. *G04F 5/14* (2013.01); *G04F 5/145* (2013.01); *H03L 7/26* (2013.01)

(58) Field of Classification Search
CPC ... G04F 5/145; G04F 5/14; H03L 7/26; C03C 15/00; C03B 11/14
USPC ................ 250/345; 331/3, 94.1; 29/428
See application file for complete search history.

(56) References Cited

U.S. PATENT DOCUMENTS

| 6,320,472 B1* | 11/2001 | Vanier ..................... G04F 5/145 |
| | | 331/94.1 |
| 2014/0139294 A1* | 5/2014 | Harasaka .................. H03L 7/26 |
| | | 331/1 R |
| 2015/0277386 A1* | 10/2015 | Passilly ................... G04F 5/145 |
| | | 331/94.1 |

FOREIGN PATENT DOCUMENTS

| EP | 2546707A2 A2 | 1/2013 |
| GB | 891598 | 3/1962 |
| JP | 2010245805 A | 10/2010 |

OTHER PUBLICATIONS

French Search Report and Written Opinion dated Sep. 10, 2015, in French Patent Application No. 14/02343, filed Oct. 17, 2014, 8 pages.

* cited by examiner

*Primary Examiner* — Arnold Kinkead
(74) *Attorney, Agent, or Firm* — Davis Wright Tremaine LLP; Michael J. Donohue

(57) ABSTRACT

The invention relates to a process for fabricating a microcell for a caesium atomic micro-clock having an inversion temperature above 80° C., comprising a step of generating a caesium vapor by heating a caesium-containing pellet, the buffer gas used containing neon and helium.

17 Claims, 7 Drawing Sheets

Table 1

| cell | $T_i$(°C) | $\Delta\nu_{bg}$(Hz) at $T_i$ | $P_{meas}$ (torr) at 0°C | $P_{meas}$ (torr) at 20°C | Ne (%) | He (%) |
|---|---|---|---|---|---|---|
| 1 | 89.7 | 30260 | 42.6 | 45.7 | 97.6 | 2.4 |
| 2 | 89.6 | 30129 | 42.4 | 45.5 | 97.6 | 2.4 |
| 3 | 91.0 | 31250 | 43.8 | 47.0 | 97.3 | 2.7 |
| 4 | 94.6 | 31072 | 43.3 | 46.4 | 96.7 | 3.3 |

FIG.8

CAESIUM ATOMIC MICRO-CLOCK MICROCELL BUFFER GAS MIXTURE

The field of the invention relates to caesium atomic micro-clocks. More precisely, the invention relates to the buffer gas used in caesium micro-clock microcells.

The performance of many compact portable systems depends on the frequency stability of the reference or standard that they use. For example, global positioning system (GPS) receivers are based on the principle of measuring propagation times of electromagnetic waves emitted by a constellation of satellites in orbit around the Earth and synchronized with each other using atomic clocks. The accuracy with which the position of a GPS receiver can be determined essentially depends on how accurately the journey time of waves emitted by a satellite in orbit around the Earth to the GPS receiver can be measured. The GPS satellite waves are coded or modulated in order to convey, in the form of a navigation message and a pseudo-random code, the reference time information of the GPS constellation. To exploit this information, the GPS receiver must possess its own clock, which allows it to date the time of reception of each wave on reception. Thus, the GPS receiver is able to compare this reception date to the coded emission time information conveyed by the received wave.

A priori, if the GPS receiver is able to determine with a high accuracy the time of the GPS constellation by virtue of a very accurate clock this enables more robust GPS navigation in the case where signal reception is liable to be disrupted, interrupted or discontinuous. It may also contribute to navigation security and integrity when such security and integrity is required as it is, for example, in aerial navigation and passenger transport applications.

A frequency standard is a physical device, such as for example an atomic clock, delivering a periodic signal the frequency of which is stable and known with a high degree of accuracy.

At present, development of systems requiring a high robustness and a high degree of security requires a stable reference frequency; typically the variation in reference frequency must be less than one microsecond per day.

Currently, the best frequency references are atomic clocks. Atomic clocks exploit the transition frequency between two energy levels of an atomic species, the value of which depends on the Bohr formula. In comparison to an oscillating signal delivered by a quartz resonator, for example, the frequency of which depends on the dimensions of the material or other empirical parameters, the frequency of an atomic clock depends only on intrinsic physical constants of the atomic species, these constants are independent of empirical conditions and do not vary over time.

FIG. 1 shows a frequency standard, namely an atomic clock, comprising two basic elements:
  an atomic reference 1 corresponding to the transition frequency of an atom between two energy levels of the spectrum of the atom in question, the two energy levels being related by the Bohr formula $E_2-E_1=h \cdot \theta_{at}$, h being Planck's constant; and
  a macroscopic oscillator 2 that delivers a useful signal of frequency that is close to the transition frequency $\theta_{at}$ of the atom of the atomic reference 1.

The atomic reference 1 allows the frequency of the oscillator 2 to be calibrated and thus the stability of the frequency of the atomic reference 1 to be transferred to the macroscopic oscillator 2.

Historically, caesium has been chosen to define the second of the International System of Units; clocks based on environmentally isolated atomic caesium are therefore considered to be primary standards. Clocks based on atoms other than caesium or on non-isolated caesium atoms are said to be secondary clocks and must be calibrated using primary clocks.

An atomic clock must deliver a signal of known and stable frequency derived from an atomic resonance. To do this, an electromagnetic field, the frequency θ of which is generated from the frequency delivered by an oscillator of frequency $\theta_{osc}$, is made to interact with an atom that resonates at the frequency $\theta_{at}=(E_2-E_1)/h$.

The response of the atomic system depends on the difference $\delta=\theta-\theta_{at}$ between the frequency of the signal emitted by the oscillator and the frequency of the atomic resonance. The response is maximal when the difference or mismatch δ is zero. The measured difference allows an error signal to be constructed and the correction that must be applied to the oscillator frequency 2 to be determined. This correction process has the objective of matching the frequency $\theta_{osc}$ of the oscillator to the atomic resonant frequency.

At present, the most compact atomic standards are rubidium atomic clocks.

This type of clock has dimensions in the region of about ten centimeters and consumes several watts of electrical power. The relatively large size of conventional compact atomic clocks and their high electrical power consumption limit their use in portable or on-board systems.

At the start of the noughties, miniaturization of portable systems became a major industrial design trend.

It is now being sought to produce miniature atomic clocks having frequency stability performances much better, by at least two orders of magnitude, than those obtained with a quartz oscillator, and having a volume comprised between 1 and 15 cm³ and consuming no more than 150 mW.

The aforementioned exemplary applications require clocks having a very high performance level.

Other applications have more modest performance constraints but much stricter constraints in terms of size and power consumption.

Compact rubidium clocks are well known. Conventional clocks comprise an optical portion and a microwave portion that are temporally and locationally separate.

The operating principle of a rubidium clock may be summarized by two steps.

In a first step, the rubidium atoms are optically pumped by virtue of a laser into one of the clock energy levels.

The expression "optical pumping" is understood to mean the ability to manipulate the atoms using a laser beam in order to populate a given energy level.

In a second step, an ancillary 6.8 GHz microwave signal is applied in order to make the atoms oscillate between the two energy levels that it is being sought to excite.

However this type of clock, although relatively compact, remains of relatively substantial size. Specifically, this type of clock requires a resonant cavity to be used the dimensions of which depend on the wavelength that it is being sought to excite.

A physical principle called coherent population trapping (CPT) and the development of microfabrication techniques means that it is now possible to miniaturize compact atomic clocks.

The principle of coherent population trapping (CPT), shown in FIG. 2, consists in carrying out all-optical interrogation.

A three-level atomic system consists of two ground states (1) and (2) with energies $E_1$ and $E_2$, respectively, coupled to a common excited state (3).

A dichromatic laser beam, originating from a laser diode (the frequency of which is directly modulated at 4.6 GHz, corresponding to half the transition frequency of atomic caesium) comprises two waves $\Gamma_{32}$ and $\Gamma_{31}$ separated by 9.192 GHz.

This laser beam will interact with caesium atoms, which will be trapped in a particular atomic state called a "dark state" in which the caesium atoms do not absorb photons; the amount of light transmitted through the atomic vapour is then increased, thereby allowing a resonant signal that may be used to correct the frequency of the local oscillator modulating the laser diode to be obtained as output.

In other words, in a CPT micro-clock the step of trapping atoms in a particular excitation state, i.e. the dark state, and the step of creating oscillation between two ground-state energy levels at the clock transition frequency are spatially and temporally combined.

This all-optical excitation or interrogation makes it possible to do away with the resonant metal cavity placed around the microcell and the dimensions of which must be matched to the wavelength that it is being sought to excite.

The absence of a resonant cavity makes it possible to produce a clock that is much smaller than conventional compact rubidium clocks.

CPT atomic micro-clocks may especially be integrated into GPS receivers, in order to replace the quartz clocks used previously.

The expression "atomic micro-clock" is understood to mean an atomic clock:
- the volume of which is comprised between a few $cm^3$ and 15 $cm^3$;
- the total power consumption of which is lower than 150 mW; and
- the relative frequency stability of which is $10^{-11}$ over one day of integration, or, in other words, that exhibits 1 µs of drift per day.

An atomic micro-clock, such as shown in FIG. 3, essentially comprises three portions: a microcell 3 in which the caesium atoms 4 that interact with the laser beam 5 are located; an optical module for shaping the light beam, especially comprising the laser diode 6 that emits the laser beam 5; and an electronic portion 7 that especially delivers the signal at 9.192 GHz.

In the present case, the microcell 3 may be likened to a small cavity the dimensions of which are of the order of one millimeter.

It contains a vapour of caesium atoms. The caesium atoms 4 are thermally agitated and they move at a speed of about 230 m·s$^{-1}$.

The collision of the caesium atoms 4 with the internal walls 3a of the microcell leads to a loss of atomic coherence, the atomic caesium 4 then depolarizing, thereby attenuating the clock signal.

However, the aim of an atomic clock is to observe the caesium atoms 4 for as long as possible.

The collisions of the caesium atoms inside the microcell 3, against the internal walls 3a of the microcell 3, must therefore be minimized in order to improve the quality of the clock signal by increasing the lifetime of the atomic coherence.

To do this, it is necessary to increase the time-of-flight of the caesium atoms between two collisions against the walls 3a.

The most commonly used technique to increase the lifetime of the CPT coherence in the microcell 3 is to dilute the alkali vapour, in the present case the caesium vapour, using a gas pressure, the gas used to do this being referred to as a buffer gas 8.

In the presence of this gas, the caesium atoms 4 collide frequently with neighbouring atoms of buffer gas 8.

Thus, the time that the alkali atoms or caesium atoms 4 take to collide with an internal wall 3a of the microcell is increased.

Furthermore, the longer the flight time of the caesium atoms 4, the narrower the width of the resonant frequency peak and the better the relative frequency stability of the clock.

However, collisions between the caesium atoms 4 and the atoms of buffer gas 8 will shift the energy levels of the atomic caesium 4 and induce a shift S in the clock frequency.

This shift S in the clock frequency, of a few hundred hertz per torr, depends directly on the nature of the buffer gas 8, and on the temperature T and pressure of the buffer gas 8 in the microcell.

In a limited temperature range, the shift S in the frequency due to the buffer gas 8 may be written as follows:

$$S=P[a+b(T-T_0)+c(T-T_0)^2]$$

where:
P is the buffer gas pressure at a reference temperature $T_0=0°$ C.;
T is the measurement temperature;
a is the pressure shift coefficient; and
b and c are linear and quadratic temperature shift coefficients, respectively.

This frequency shift S will therefore have a direct impact on the stability of the frequency of the clock.

Customarily, to mitigate this drawback, the buffer gas 8 is a mixture of two gases: a first gas that induces a shift in the clock frequency toward higher frequencies and a second gas that induces a shift in the clock frequency toward lower frequencies. Adjusting the proportions of the two constituent gases of the buffer gas 8 mixture allows the desired so-called "inversion temperature" to be obtained.

In this case, the shift S in frequency may be written as follows:

$$S=P[(r_1a_1+r_2a_2)+(r_1b_1+r_2b_2)\cdot(T-T_0)+(r_1c_1+r_2c_2)^2(T-T_0)^2]$$

where:
$a_1$, $a_2$, $b_1$, $b_2$, $c_1$, $c_2$ are coefficients specific to the constituent gases of the buffer gas 8; and
$r_1$ and $r_2$ represent percentages relative to the total pressure of the gases, $r_1+r_2=1$.

The derivative with respect to T of this relationship depends on the partial pressures of the constituent gases of the buffer gas 8. It is, therefore, important to control the partial pressures of the gases during the filling of the cell.

The expression "inversion temperature" is understood to mean a temperature at which the sensitivity of the clock frequency to variations in temperature cancels out to the first order.

In other words, the effects of each of the two constituent gases of the buffer gas 8 mixture cancel out at a certain temperature called the inversion temperature. At this temperature, the clock will be much less sensitive to temperature variations.

Using a buffer gas exhibiting an inversion temperature is thus a good way of improving the mid- and long-term frequency stability of the clock.

Generally, the buffer gas 8 mixture used contains nitrogen and argon.

In the United States, research teams have developed micro-clocks comprising a caesium vapour generated by chemical reaction prior or subsequently to the step of closing the microcell 3. This microcell uses a buffer gas 8 containing an Ar—N$_2$ mixture.

This type of microcell 3 especially makes applications at high temperatures, typically temperatures higher than 85° C., possible.

However, this Ar—N$_2$ buffer gas 8 mixture is incompatible with a method for fabricating the microcell 3 in which the caesium vapour is generated using a pellet comprising caesium after the microcell 3 has been sealably closed, such as described in the publication M. Hasegawa, R K. Chutani, C. Gorecki, R. Boudot, P. Dziuban, V. Giordano, S Clatot—"Microfabrication of caesium vapour cells with buffer gas for MEMS atomic clocks"—*Sensors and Actuators A: Physical* 167 (2), 594-601, 2011.

One aim of the invention is to provide a buffer gas 8 mixture, of inversion temperature above 80° C., compatible with a microcell fabrication method, such as described in the aforementioned publication, the step of generating the caesium vapour of which is carried out after the step of closing the microcell.

Thus, according to one aspect of the invention, a process is provided for fabricating a microcell for a caesium atomic micro-clock having an inversion temperature above 80° C., comprising:
 a first step of fabricating a micro-clock microcell structure, so as to obtain a first cavity and a second cavity that are connected together by channels;
 a second step of fastening a lower plate under the structure of the microcell so as to create a first cavity and a second cavity that are closed on the lower side of the structure;
 a third step of introducing into the first cavity a caesium-containing pellet;
 a fourth step of introducing a gas mixture containing neon and helium into the structure of the microcell;
 a fifth step of fastening an upper plate so as to sealably close the first and second cavities; and
 a sixth step of heating the caesium-containing pellet.

The use of a gas mixture containing neon and helium especially allows microcells to be fabricated using a particular process consisting in, after the microcell has been sealably closed, generating a caesium vapour by heating the caesium-containing pellet.

Advantageously, the first step of fabricating the structure of the microcell comprises:
 a first sub-step of forming two cavities in a piece of silicon; and
 a second sub-step of producing channels.

Advantageously, the two cavities are formed using a deep reactive ion etching process.

Advantageously, the pellet is heated using a laser allowing locally the temperature of about 700° C. required to generate the caesium vapour to be reached.

Advantageously, the lower plate and the upper plate contain borosilicate glass.

Advantageously, the second and fifth steps of fastening the lower and upper plates are steps of anodic bonding carried out by heating to a temperature of 350° C. and by applying a potential difference of 900 V between the lower plate and the structure and the upper plate and the structure, respectively, allowing the microcell to be sealably closed so that the very volatile helium gas does not escape.

Advantageously, the percentage of helium in the Ne—He mixture depends on the inversion temperatures that it is desired to obtain. Typically, the inversion temperatures are comprised between 80° C. and about 140° C.

Advantageously, the pressure of the Ne—He mixture inside the microcell is comprised between 10 and 150 torr at a temperature of 0° C.

According to another aspect of the invention, a microcell of a caesium atomic micro-clock having an inversion temperature above 80° C. is provided, comprising a gas mixture containing caesium, neon and helium.

The invention will be better understood and other advantages will become apparent on reading the following description given by way of nonlimiting example, and by virtue of the appended figures, in which:

FIG. 1, described above, shows the operating principle of a prior-art atomic clock;

FIG. 2, described above, illustrates the principle of the coherent population trapping effect;

FIG. 3, described above, shows the principle and the main constituent elements of a caesium atomic micro-clock;

Figure 6:
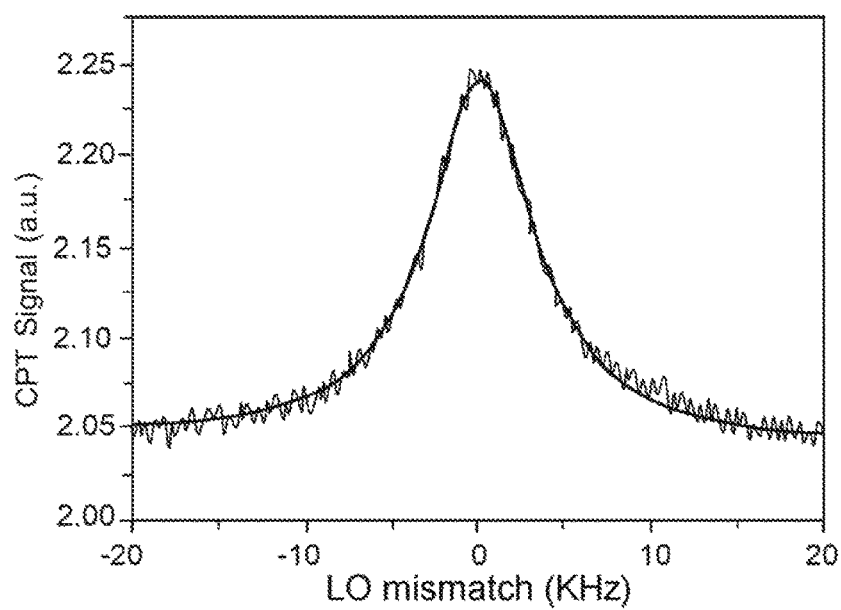

FIG. 6 illustrates an exemplary resonant CPT peak of a clock signal detected with a Cs—Ne—He microcell, according to one aspect of the invention; and FIGS. 7a to 7d are graphical representations of the clock frequency as a function of Cs—Ne—He cell temperature for various buffer gas compositions, these figures demonstrating the inversion temperature for these various mixtures; and FIG. 8 illustrates Table 1, which summarizes the observations and deductions made from the curves in FIGS. 7a to 7d.

FIGS. 4a to 4f illustrate the steps for producing a caesium microcell described in the publication by M. Hasegawa et al. cited above.

In the present case, the caesium vapour of the microcell is generated only after the step of definitively closing the microcell 3.

Figure 1:
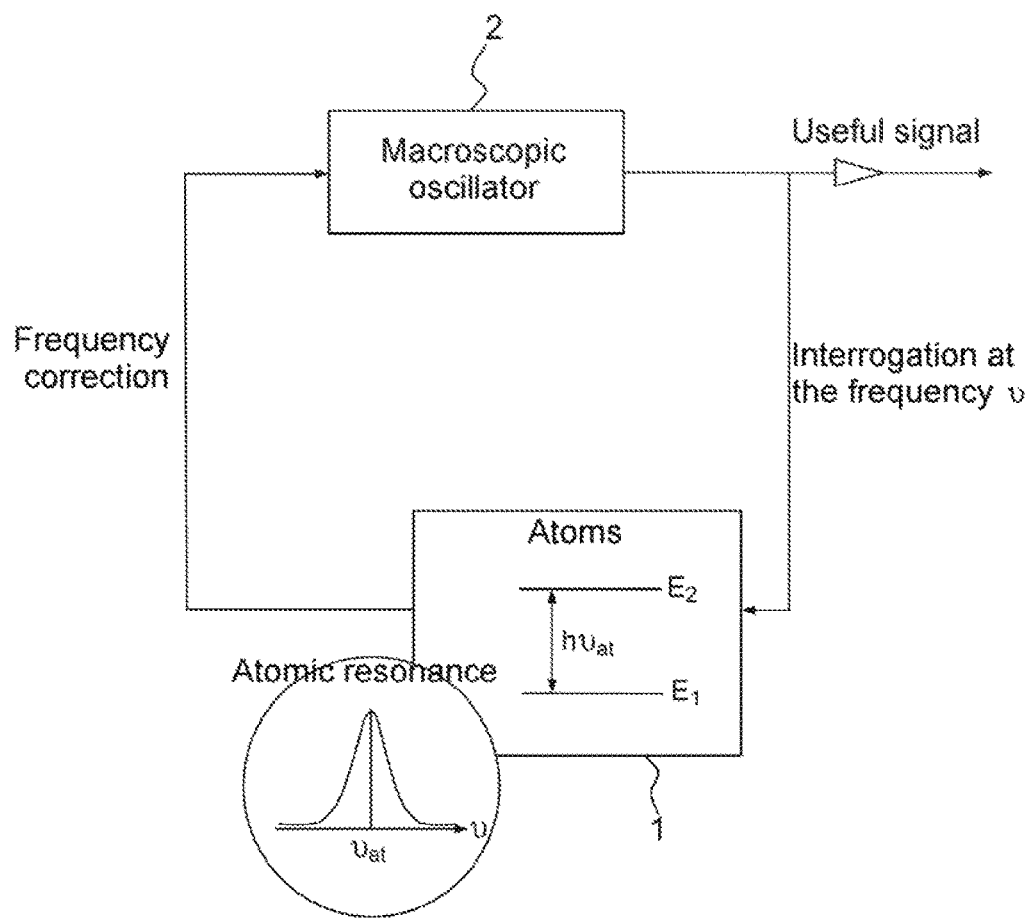
Figure 2:
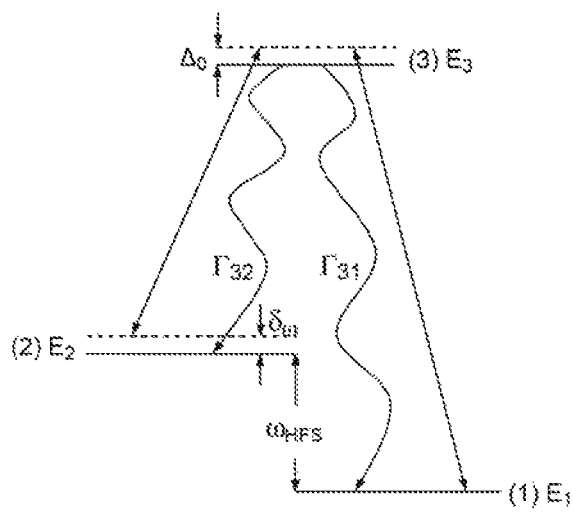
Figure 3:
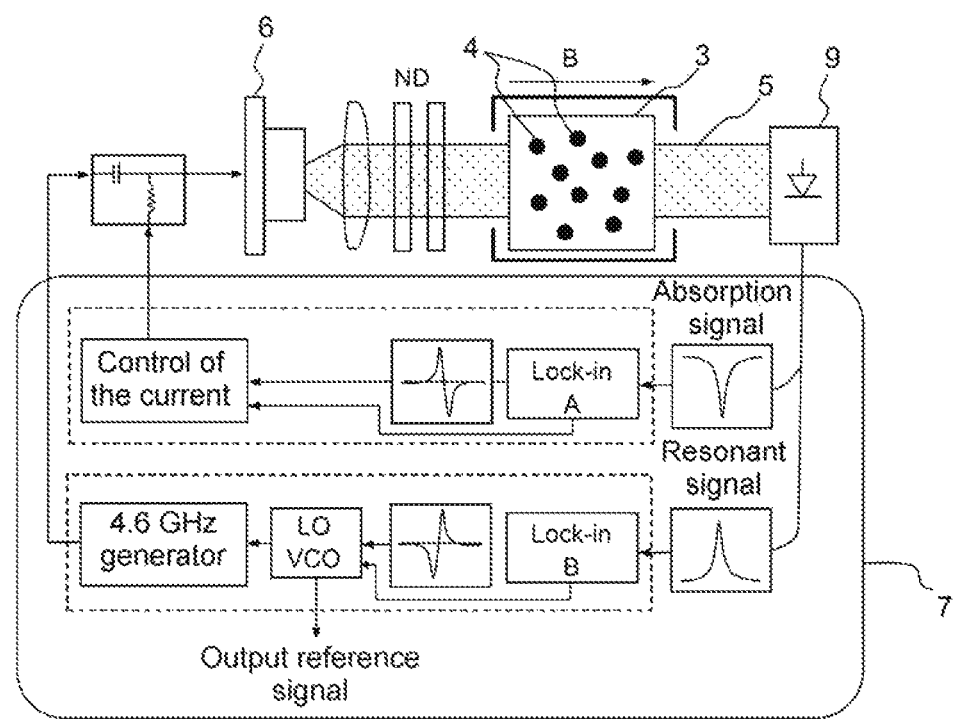
Figure 4A:
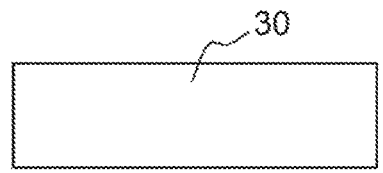
FIGS. 4a to 4f illustrate steps for producing a microcell according to the invention.
Figure 4B:
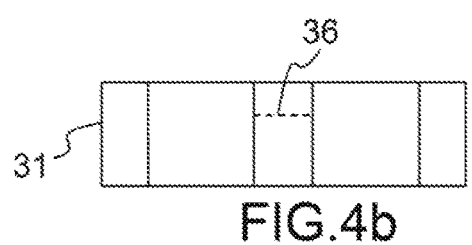
Figure 4C:
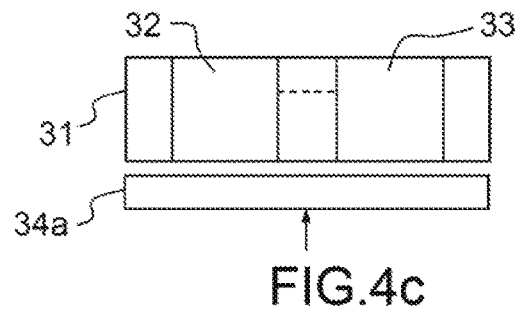
Figure 4D:
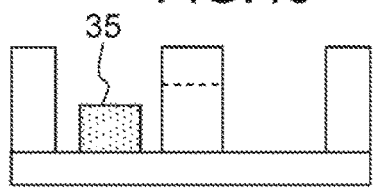
Figure 4E:
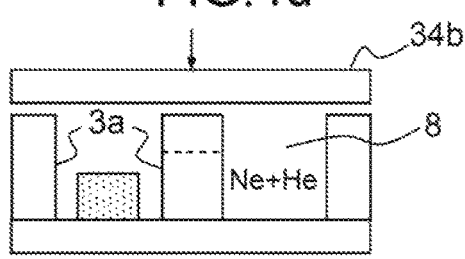
Figure 4F:
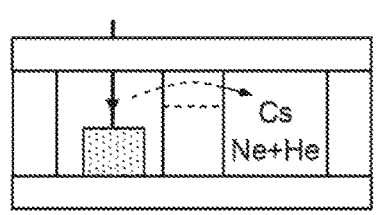

In a first step (FIG. 4b), the structure 31 of the microcell 3 shown in FIG. 4a is produced.

The term "structure" 31 is understood to mean the block or piece of material 30 comprising the first and second cavities 32, 33 connected together by channels.

In the present case, the structure 31 is produced from a silicon block 30 or silicon wafer in which two cavities 32 and 33 are etched. Advantageously, the piece of silicon is worked using an etching method such as deep reactive ion etching (DRIE). Alternatively, other methods may be implemented, such as chemical etching in KOH.

In a second step (FIG. 4c), a lower plate 34a is fastened under the structure 31. Advantageously, the plate 34a is fastened by anodic bonding at a temperature of no more than 350° C. while applying a potential difference between the lower plate 34a and the material of the structure 31; typically, the material of the structure is silicon.

In a third step (FIG. 4d) a caesium-containing pellet 35 or briquette is introduced.

The expression "caesium briquette or pellet" 35 is understood to mean a solid element especially containing caesium and intended to allow a caesium vapour to be created inside the microcell under the effect of heat.

Analyses have demonstrated that other materials and especially zirconium are present in the caesium pellet 35 used to generate the caesium vapour.

Studies have shown that the zirconium present in the caesium pellet 35 absorbs the nitrogen of the N$_2$—Ar buffer gas customarily used, thereby explaining the fact that it is not possible to use the N$_2$—Ar mixture in a process for producing a microcell using a caesium pellet. Specifically, the nitrogen present in the buffer gas 8 is absorbed and the mixture no longer plays its role as a buffer gas.

In a fourth step (FIG. 4e), the buffer gas 8 mixture according to the invention is introduced. In the present case, the buffer gas 8 mixture contains neon and helium, prior to the fifth step (FIG. 4f) of closing the structure 31 with an upper plate 34b on the top of the structure 31.

The buffer gas 8 mixture containing neon and helium is not absorbed by the caesium pellet 35 and allows inversion temperatures above 80° C. to be achieved.

Typically, the various Ne—He buffer gas compositions allow temperatures comprised between 80° C. and about 140° C. to be achieved.

In a sixth step of heating the caesium pellet to a temperature of 700 to 800° C., the caesium vapour is generated. The caesium vapour will then migrate toward the other cavity via the channels 36.

Figure 5:
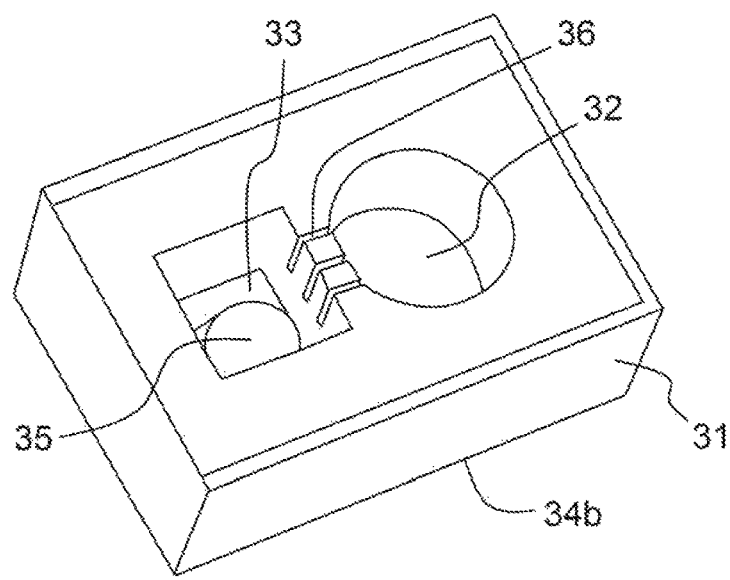
FIG. 5 is a schematic of a microcell according to the invention.

FIG. 5 is a perspective view of the microcell 3, according to one aspect of the invention.

The microcell 3 contains a first cavity 32 and a second cavity 33. In the present case, the first cavity 32 is circular and the second cavity 33 is square in shape; however, it will be noted that the shapes of these cavities 32 and 33 are of no particular importance and that the cavities may therefore be of any shape. The two cavities 32 and 33 are furthermore connected together by narrow channels 36.

Moreover, a pellet or briquette 35 containing caesium in the form of a metal alloy is placed inside one of the cavities 32 and 33, in the present case inside the second cavity 33.

The cavity 32 is filled with a buffer gas 8 mixture (not shown in FIG. 5), the mixture containing neon and helium. After the microcell has been definitively closed by fastening the upper plate 34b in place, heating by laser to a temperature of 700-800° C. of the caesium-containing pellet 35 generates a caesium vapour inside the microcell 3.

FIGS. 7a-7d are graphical representations of frequency as a function of temperature for various neon- and helium-containing buffer gas 8 compositions. The various conclusions made from these curves are summarized in Table 1 of FIG. 8.

More particularly, these curves demonstrate the shift S in clock frequency as a function of the temperature of the microcell 3 containing a caesium vapour and a buffer gas 8 mixture, in order to demonstrate the presence of an inversion temperature for which the sensitivity of the clock frequency to temperature variations cancels out to the first order.

To produce these curves, a laser diode emitting a resonant laser beam at a wavelength of 894.6 nm (line D1 of atomic caesium) was used, the beam was introduced into a modulator that modulated the beam using a local oscillator generating a signal of 4.596 GHz, corresponding to half the caesium clock frequency (9.192 GHz). The optical spectrum then consisted of two lines separated by 9.192 GHz.

The laser beam was transmitted to the Cs—Ne—He microcell; the temperature of the microcell was regulated. In addition, the microcell was placed in a magnetic field of a few micro-tesla, so as to isolate the clock transition. The radiant power transmitted was detected by a photodiode.

To detect the CPT resonance, the frequency of the local oscillator controlling the modulator was scanned and the variation in the radiant power transmitted through the cell measured. When the frequency separation between the two optical rays output from the modulator was rigorously equal to the hyperfine transition frequency of the atoms, the caesium atoms were trapped in a particular state, called the dark state, in which they no longer absorbed incident photons. The radiant power transmitted through the cell was then maximal and a resonant peak (FIG. 6) was output from the cell and detected. An electronic module allowed the frequency of the local oscillator to be locked to the peak of the CPT signal: an atomic clock was thus formed.

The various curves in FIGS. 7a to 7d demonstrate the fact that inversion temperature depends directly on the partial pressures of neon and helium.

Figure 7A:
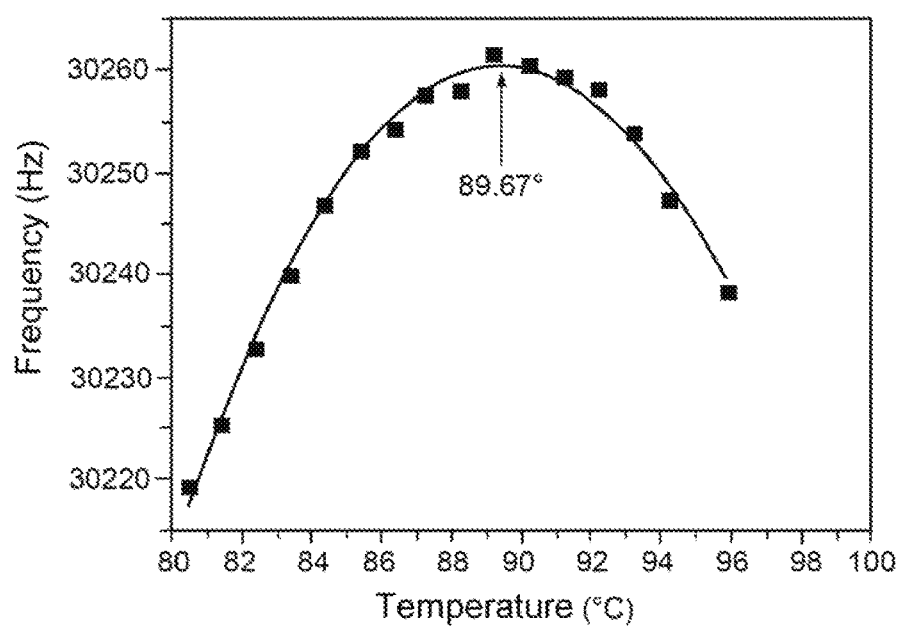
Figure 7B:
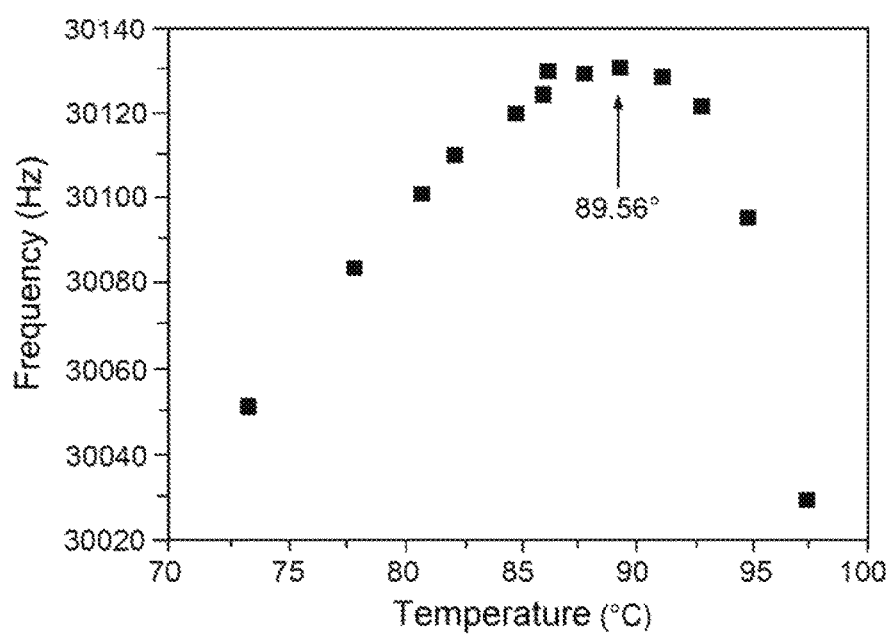
Figure 7C:
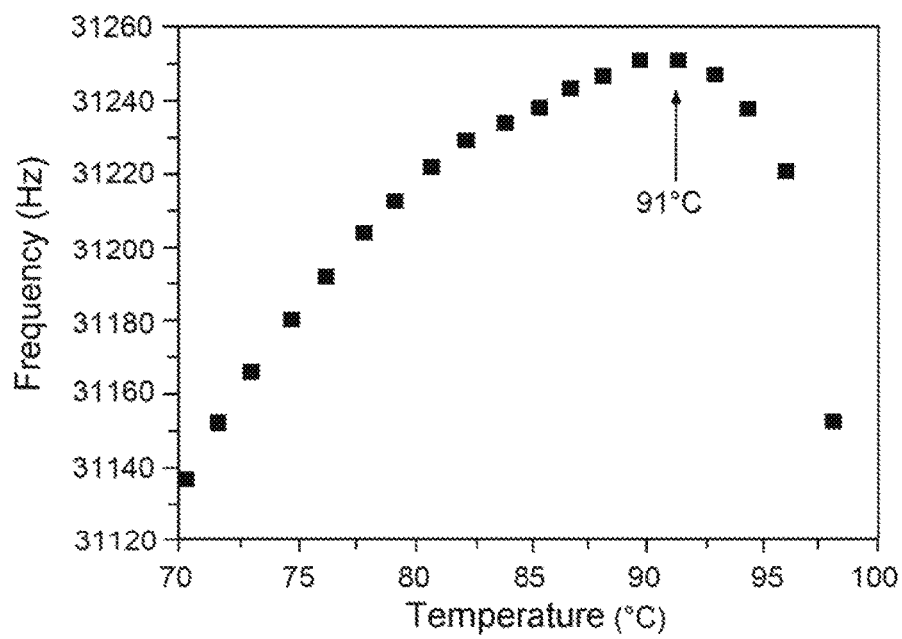
Figure 7D:
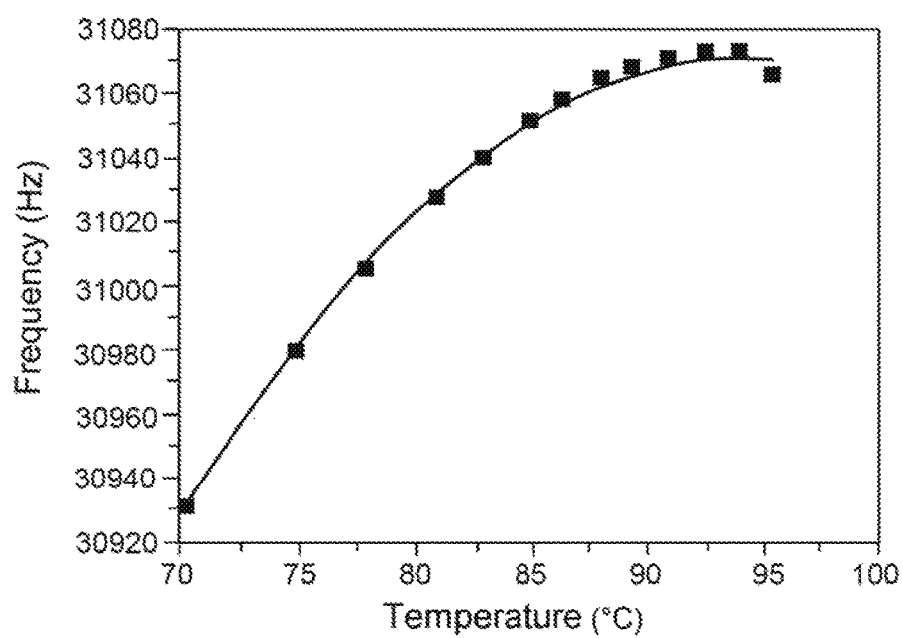

The curve 41 in FIG. 7a was produced with a cell according to the invention comprising a buffer gas 8 mixture containing 2.4% helium and 97.6% neon. The curve 41 has a quadratic shape, the point at the apex corresponding to the inversion temperature. In the present case, the inversion temperature was 89.7° C.

The curves 43 and 44 are similar shapes to the shape of the curve 41, only the proportion of helium being changed; for a percentage of helium of 3.3% the inversion temperature was 94.6° C.

It will be understood that clearly the higher the proportion of helium in the buffer gas 8 the higher the inversion temperature.

These results do not prevent higher proportions of helium from being envisioned; it would be possible to further increase the inversion temperature and to potentially reach inversion temperatures of about 110° C. or even 140° C.

Micro-clocks produced with a neon-helium mixture could be used in an on-board device for applications in high-temperature environments.

Of course, a buffer gas 8 containing an Ne—He mixture may of course be used in other types of microcells, in particular microcells not using caesium pellets 35.

The invention claimed is:

1. Process for fabricating a microcell for a caesium atomic micro-clock having an inversion temperature above 80° C., comprising:
    a first step of fabricating a micro-clock microcell structure, so as to obtain a first cavity and a second cavity that are connected together by channels;
    a second step of fastening a lower plate under the structure of the microcell so as to create a first cavity and a second cavity that are closed on the lower side of the structure;
    a third step of introducing into the first cavity a caesium-containing pellet;
    a fourth step of introducing a gas mixture containing neon (Ne) and helium (He) into the structure of the microcell in which the percentage of helium in the Ne—He gas mixture depends on the sought-after inversion temperature;
    a fifth step of fastening an upper plate so as to sealably close the first and second cavities; and
    a sixth step of heating the caesium-containing pellet.

2. Process according to claim 1, in which the first step of fabricating the structure of the microcell comprises:
    a first sub-step of forming the two cavities in a piece of silicon; and
    a second sub-step of producing the channels.

3. Process according to claim 1, in which the two cavities are produced using a deep reactive ion etching process.

4. Process according to claim 1, in which the pellet is heated using a laser.

5. Process according to claim 1, in which the lower plate and the upper plate contain borosilicate glass.

6. Process according to claim 1, in which the second and fifth steps of fastening the lower and upper plates comprise an anodic bonding step.

7. Process according to claim 6, in which the anodic bonding steps are carried out by heating to a temperature of 350° C. and by applying a potential difference of 900 V between the upper plate and the structure and the lower plate and the structure.

8. Process according to claim 1, in which the pressure of the Ne—He mixture inside the microcell is comprised between 10 and 150 torr at a temperature of 0° C.

9. Microcell of a caesium atomic micro-clock having an inversion temperature above 80° C., comprising a gas mixture containing caesium, neon and helium.

10. Process according to claim 2, in which the two cavities are produced using a deep reactive ion etching process.

11. Process according to claim 2, in which the pellet is heated using a laser.

12. Process according to claim 2, in which the lower plate and the upper plate contain borosilicate glass.

13. Process according to claim 2, in which the second and fifth steps of fastening the lower and upper plates comprise an anodic bonding step.

14. Process according to claim 13, in which the anodic bonding steps are carried out by heating to a temperature of 350° C. and by applying a potential difference of 900 V between the upper plate and the structure and the lower plate and the structure.

15. Process according to claim 2, in which the pressure of the Ne—He mixture inside the microcell is comprised between 10 and 150 torr at a temperature of 0° C.

16. Process according to claim 3, in which the lower plate and the upper plate contain borosilicate glass.

17. Process according to claim 3, in which the second and fifth steps of fastening the lower and upper plates comprise an anodic bonding step.

\* \* \* \* \*